United States Patent
Tsuru

(10) Patent No.: US 11,171,657 B2
(45) Date of Patent: Nov. 9, 2021

(54) PHASE AND AMPLITUDE CONTROLLED OSCILLATION DEVICE

(71) Applicant: Mitsubishi Electric Corporation, Tokyo (JP)

(72) Inventor: Masaomi Tsuru, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 17/109,513

(22) Filed: Dec. 2, 2020

(65) Prior Publication Data

US 2021/0091774 A1 Mar. 25, 2021

Related U.S. Application Data

(63) Continuation of application No. PCT/JP2018/024898, filed on Jun. 29, 2018.

(51) Int. Cl.
| | | |
|---|---|---|
| *H03L 7/099* | (2006.01) | |
| *H03K 5/26* | (2006.01) | |
| *H03L 7/093* | (2006.01) | |
| *H03L 7/23* | (2006.01) | |
| *H03L 7/24* | (2006.01) | |
| *H03L 7/197* | (2006.01) | |
| *H03C 5/00* | (2006.01) | |

(52) U.S. Cl.
CPC ............ *H03L 7/099* (2013.01); *H03C 5/00* (2013.01); *H03K 5/26* (2013.01); *H03L 7/093* (2013.01); *H03L 7/1974* (2013.01); *H03L 7/23* (2013.01); *H03L 7/24* (2013.01)

(58) Field of Classification Search
CPC ........... H03K 5/26; H03L 7/099; H03L 7/093; H03L 7/23; H03L 7/24; H03L 7/1974; H03C 5/00
USPC ..................... 331/2, 46, 47, 12, 15; 375/295
See application file for complete search history.

(56) References Cited

U.S. PATENT DOCUMENTS

| | | | | |
|---|---|---|---|---|
| 8,065,553 B2 * | 11/2011 | Tamura | ................. | G11C 8/18 713/600 |
| 2010/0171532 A1 | 7/2010 | Tajima et al. | | |
| 2019/0393882 A1 * | 12/2019 | Bassi | ................. | H03B 19/14 |

FOREIGN PATENT DOCUMENTS

| | | |
|---|---|---|
| JP | 2000-353929 A | 12/2000 |
| JP | 2008-141657 A | 6/2008 |
| JP | 4718566 B2 | 7/2011 |
| WO | WO 2007/091516 A1 | 8/2007 |

* cited by examiner

*Primary Examiner* — Arnold M Kinkead

(74) *Attorney, Agent, or Firm* — Birch, Stewart, Kolasch & Birch, LLP

(57) ABSTRACT

A phase and amplitude controlled oscillation device is configured in such a manner that a first controller and a second controller control a phase of a combined output wave obtained by a combiner by performing control to shift phases of respective oscillation frequencies of a first oscillator and a second oscillator in the same direction, and control an amplitude of the combined output wave obtained by the combiner by performing control to shift the phases of the respective oscillation frequencies of the first oscillator and the second oscillator in opposite directions.

11 Claims, 8 Drawing Sheets

PHASE AND AMPLITUDE CONTROLLED OSCILLATION DEVICE

CROSS REFERENCE TO RELATED APPLICATION

This application is a Continuation of PCT International Application No. PCT/JP2018/024898, filed on Jun. 29, 2018, which is hereby expressly incorporated by reference into the present application.

TECHNICAL FIELD

The invention relates to a phase and amplitude controlled oscillation device that controls the phase and amplitude of a combined output wave.

BACKGROUND ART

The following Patent Literature 1 discloses a phase-locked loop frequency synthesizer of a fractional-N system.

The phase-locked loop frequency synthesizer disclosed in Patent Literature 1 controls the phase of an output signal by giving an offset to a control pattern of a frequency divider that is locked to a reference signal.

CITATION LIST

Patent Literatures

Patent Literature 1: WO 2007/091516 A

SUMMARY OF INVENTION

Technical Problem

The phase-locked loop frequency synthesizer disclosed in Patent Literature 1 can control the phase of an output signal.

However, the phase-locked loop frequency synthesizer disclosed in Patent Literature 1 has a problem that the amplitude of the output signal cannot be controlled.

The invention is made to solve the above problem, and an object of the invention is to obtain a phase and amplitude controlled oscillation device that can control the phase and amplitude of a combined output wave.

Solution to Problem

A phase and amplitude controlled oscillation device according to the invention includes: a reference oscillator outputting an oscillation frequency; a first oscillator whose oscillation frequency is locked to the oscillation frequency of the reference oscillator; a second oscillator whose oscillation frequency is locked to the oscillation frequency of the reference oscillator; a combiner generating a combined output wave by combining an output wave from the first oscillator and an output wave from the second oscillator; a first controller controlling a phase of the oscillation frequency of the first oscillator; and a second controller controlling a phase of the oscillation frequency of the second oscillator. The first and second controllers control a phase of the combined output wave generated by the combiner by performing control to shift the phases of the oscillation frequencies of the respective first and second oscillators in a same direction, and control an amplitude of the combined output wave generated by the combiner by performing control to shift the phases of the oscillation frequencies of the respective first and second oscillators in opposite directions.

Advantageous Effects of Invention

According to the invention, the phase and amplitude controlled oscillation device is configured in such a manner that the first and second controllers control a phase of the combined output wave generated by the combiner by performing control to shift the phases of the oscillation frequencies of the respective first and second oscillators in a same direction, and control an amplitude of the combined output wave generated by the combiner by performing control to shift the phases of the oscillation frequencies of the respective first and second oscillators in opposite directions. Therefore, the phase and amplitude controlled oscillation device according to the invention can control the phase and amplitude of the combined output wave.

BRIEF DESCRIPTION OF DRAWINGS

FIG. 3 is an explanatory diagram showing the phase and amplitude of a combined output wave obtained by the combiner 4 at a time when a control signal that changes an oscillation frequency by $\Delta f_o$ is provided to oscillation frequency control terminals 2a and 3a.

FIG. 4 is an explanatory diagram showing the phase and amplitude of a combined output wave obtained by the combiner 4 at a time when a control signal that changes an oscillation frequency by $\Delta f_o$ is provided to the oscillation frequency control terminal 2a and a control signal that changes an oscillation frequency by $-\Delta f_o$ is provided to the oscillation frequency control terminal 3a.

Each of FIGS. 8A and 8B is a configuration diagram showing a phase and amplitude controlled oscillation device of a fourth embodiment under a situation in which phase control is performed.

DESCRIPTION OF EMBODIMENTS

To describe the invention in more detail, some embodiments for carrying out the invention will be described below with reference to the accompanying drawings.

First Embodiment

Figure 1A:
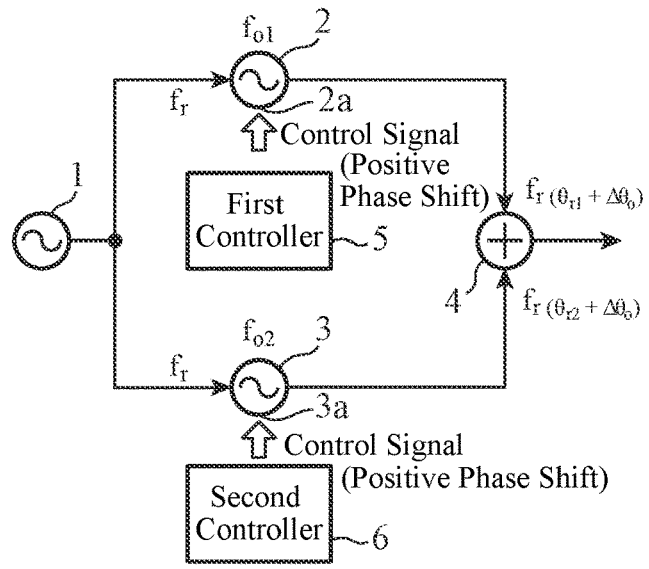
FIG. 1A is a configuration diagram showing a phase and amplitude controlled oscillation device of a first embodiment under a situation in which phase control is performed.
Figure 1B:
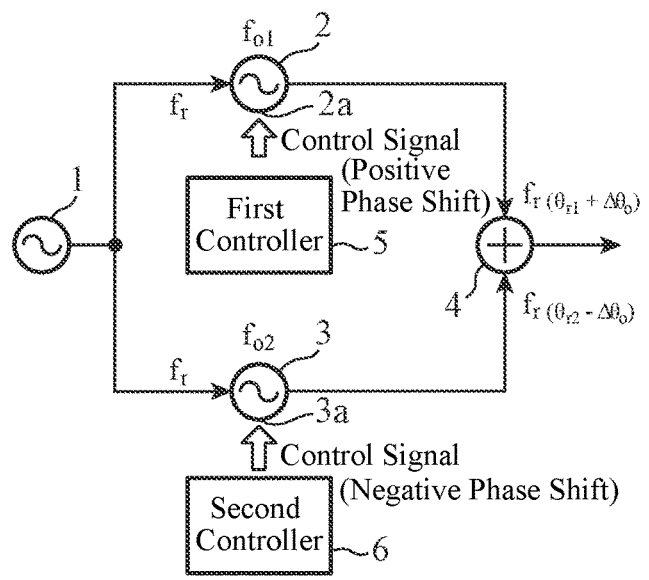
FIG. 1B is a configuration diagram showing the phase and amplitude controlled oscillation device of the first embodiment under a situation in which amplitude control is performed.

Each of FIGS. 1A and 1B is a configuration diagram showing a phase and amplitude controlled oscillation device according to a first embodiment.

FIG. 1A is a configuration diagram showing the phase and amplitude controlled oscillation device of the first embodiment under a situation in which phase control is performed.

FIG. 1B is a configuration diagram showing the phase and amplitude controlled oscillation device of the first embodiment under a situation in which amplitude control is performed.

In FIGS. 1A and 1B, a reference oscillator 1 outputs a stable oscillation frequency $f_r$.

A first oscillator 2 is an injection-locked voltage-controlled oscillator (injection-locked oscillator) into which an output wave from the reference oscillator 1 is injected.

By the injection of the output wave from the reference oscillator 1 into the first oscillator 2, an oscillation frequency $f_{o1}$ is locked to the oscillation frequency $f_r$ of the reference oscillator 1.

A second oscillator 3 is an injection-locked voltage-controlled oscillator into which an output wave from the reference oscillator 1 is injected.

By the injection of the output wave from the reference oscillator 1 into the second oscillator 3, an oscillation frequency $f_{o2}$ is locked to the oscillation frequency $f_r$ of the reference oscillator 1.

Note that the first oscillator 2 and the second oscillator 3 are injection-locked voltage-controlled oscillators having the same configuration, and the characteristics of oscillation frequency with respect to direct-current control voltages provided to oscillation frequency control terminals 2a and 3a, etc., are the same.

A combiner 4 combines an output wave from the first oscillator 2 and an output wave from the second oscillator 3 and outputs the combined output wave. The combiner 4 is, for example, a power combiner such as a Wilkinson combiner.

A first controller 5 is connected to the oscillation frequency control terminal 2a of the first oscillator 2, and controls the phase of the oscillation frequency of the first oscillator 2 by outputting (applying) a control signal (direct-current voltage) that controls the oscillation frequency $f_{o1}$ of the first oscillator 2 to the oscillation frequency control terminal 2a.

A second controller 6 is connected to the oscillation frequency control terminal 3a of the second oscillator 3, and controls the phase of the oscillation frequency of the second oscillator 3 by outputting (applying) a control signal (direct-current voltage) that controls the oscillation frequency $f_{o2}$ of the second oscillator 3 to the oscillation frequency control terminal 3a.

The first controller 5 and the second controller 6 control the phase of the combined output wave obtained by the combiner 4 by performing control to shift the phase of the oscillation frequency of the first oscillator 2 and the phase of the oscillation frequency of the second oscillator 3 in the same direction.

The first controller 5 and the second controller 6 control the amplitude of the combined output wave obtained by the combiner 4 by performing control to shift the phase of the oscillation frequency of the first oscillator 2 and the phase of the oscillation frequency of the second oscillator 3 in opposite directions.

Next, operation of the phase and amplitude controlled oscillation device shown in FIG. 1 will be described.

The reference oscillator 1 stably oscillates at the oscillation frequency $f_r$, and outputs an output wave with the frequency $f_r$ as an injection wave to each of the first oscillator 2 and the second oscillator 3.

By the injection of the output wave with the frequency $f_r$ into the first oscillator 2 from the reference oscillator 1, the oscillation frequency $f_{o1}$ of the first oscillator 2 is locked to the oscillation frequency $f_r$ of the reference oscillator 1.

By the injection of the output wave with the frequency $f_r$ into the second oscillator 3 from the reference oscillator 1, the oscillation frequency $f_{o2}$ of the second oscillator 3 is locked to the oscillation frequency $f_r$ of the reference oscillator 1.

By the locking of the oscillation frequency $f_{o1}$ of the first oscillator 2 and the oscillation frequency $f_{o2}$ of the second oscillator 3 to the oscillation frequency $f_r$ of the reference oscillator 1, the relation $f_{o1}=f_{o2}=f_r$ is satisfied.

Here, it is assumed that the phase of an output wave from the first oscillator 2 in which the oscillation frequency $f_{o1}$ is locked to the oscillation frequency $f_r$ of the reference oscillator 1 is Ori, and the phase of an output wave from the second oscillator 3 in which the oscillation frequency $f_{o2}$ is locked to the oscillation frequency $f_r$ of the reference oscillator 1 is $\theta_{r2}$.

As shown in FIGS. 2A and 2B, the combiner 4 combines an output wave from the first oscillator 2 and an output wave from the second oscillator 3 and outputs the combined output wave. The combining of two output waves by the combiner 4 is vector synthesis.

Figure 2:
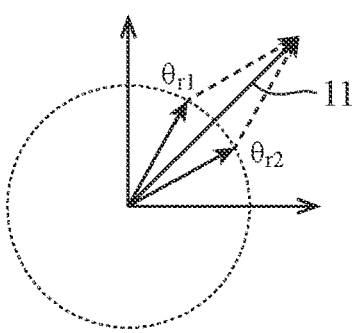
FIG. 2 is an explanatory diagram showing the phase of a combined output wave obtained by a combiner 4 at a time when oscillation frequencies $f_{o1}$ and $f_{o2}$ are locked to an oscillation frequency $f_r$.

FIG. 2 is an explanatory diagram showing the phase of a combined output wave obtained by the combiner 4 at a time when the oscillation frequencies $f_{o1}$ and $f_{o2}$ are locked to the oscillation frequency $f_r$.

In FIG. 2, the reference sign 11 indicates the combined output wave obtained by the combiner 4.

The first oscillator 2 oscillates at the oscillation frequency $f_{o1}$ when an output wave with the frequency $f_r$ is not injected into the first oscillator 2 from the reference oscillator 1 and a control signal that changes the oscillation frequency $f_{o1}$ by $\Delta f_o$ is not provided to the oscillation frequency control terminal 2a.

When a control signal that changes the oscillation frequency $f_{o1}$ by $\Delta f_o$ is provided to the oscillation frequency control terminal 2a under a condition that an output wave with the frequency $f_r$ is not injected as an injection wave into the first oscillator 2, the oscillation frequency changes from $f_{o1}$ to $(f_{o1}+\Delta f_o)$.

When a control signal that changes the oscillation frequency $f_{o1}$ by $\Delta f_o$ is provided to the oscillation frequency control terminal 2a under a condition that an output wave with the frequency $f_r$ is injected into the first oscillator 2 from the reference oscillator 1, the oscillation frequency is $f_r$ and the phase Ori of an output wave is shifted by $\Delta\theta_1$ on the basis of a difference between the oscillation frequency $f_r$ and the frequency $(f_{o1}+\Delta f_o)$.

The second oscillator 3 oscillates at the oscillation frequency $f_{o2}$ when an output wave with the frequency $f_r$ is not injected into the second oscillator 3 from the reference oscillator 1 and a control signal that changes the oscillation frequency $f_{o2}$ by $\Delta f_o$ is not provided to the oscillation frequency control terminal 3a.

When a control signal that changes the oscillation frequency $f_{o2}$ by $\Delta f_o$ is provided to the oscillation frequency control terminal 3a under a condition that an output wave with the frequency $f_r$ is not injected into the second oscillator 3, the oscillation frequency changes from $f_{o2}$ to ($f_{o2}+\Delta f_o$).

When a control signal that changes the oscillation frequency $f_{o2}$ by $\Delta f_o$ is provided to the oscillation frequency control terminal 3a under a condition that an output wave with the frequency $f_r$ is injected into the second oscillator 3 from the reference oscillator 1, the oscillation frequency is $f_r$ and the phase $\theta_{r2}$ of an output wave is shifted by $\Delta \theta_2$ on the basis of a difference between the oscillation frequency $f_r$ and the frequency ($f_{o2}+\Delta f_o$).

Here, the first oscillator 2 and the second oscillator 3 are injection-locked voltage-controlled oscillators having the same configuration, and the characteristics of oscillation frequency with respect to control voltages provided to the oscillation frequency control terminals 2a and 3a, etc., are the same, and thus, $f_{o2}$ is substantially equal to $f_{o1}$ and the relation $\Delta \theta_1 = \Delta \theta_2 = \Delta \theta_o$ is satisfied.

Figure 3:
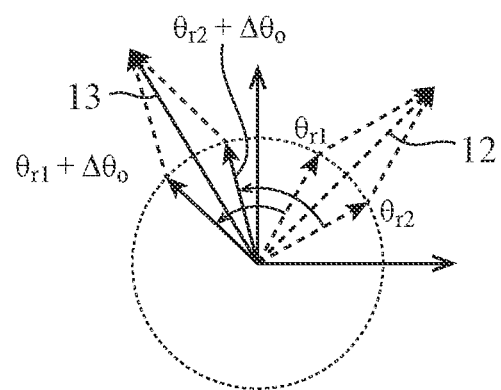

As shown in FIG. 3, the combiner 4 combines an output wave from the first oscillator 2 and an output wave from the second oscillator 3 and outputs the combined output wave.

FIG. 3 is an explanatory diagram showing the phase and amplitude of a combined output wave obtained by the combiner 4 at a time when a control signal that changes an oscillation frequency by $\Delta f_o$ is provided to the oscillation frequency control terminals 2a and 3a.

In FIG. 3, the reference sign 12 indicates a combined output wave obtained when an output wave with the frequency $f_r$ is injected into each of the first oscillator 2 and the second oscillator 3 and a control signal that changes an oscillation frequency by $\Delta f_o$ is not provided to the oscillation frequency control terminals 2a and 3a.

The reference sign 13 indicates a combined output wave obtained by the combiner 4 when an output wave with the frequency $f_r$ is injected into each of the first oscillator 2 and the second oscillator 3 and a control signal that changes an oscillation frequency by $\Delta f_o$ is provided to the oscillation frequency control terminals 2a and 3a.

When the combined output wave 12 is compared with the combined output wave 13, their amplitudes are the same but their phases are different from each other.

Therefore, by the first controller 5 and the second controller 6, by performing control to shift the phase of the oscillation frequency of the first oscillator 2 and the phase of the oscillation frequency of the second oscillator 3 in the same direction, without changing the amplitude of a combined output wave obtained by the combiner 4, the phase can be changed.

When a control signal that changes the oscillation frequency $f_{o2}$ by $-\Delta f_o$ is provided to the oscillation frequency control terminal 3a under a condition that an output wave with the frequency $f_r$ is not injected into the second oscillator 3, the oscillation frequency changes from $f_{o2}$ to ($f_{o2}-\Delta f_o$).

When a control signal that changes the oscillation frequency $f_{o2}$ by $-\Delta f_o$ is provided to the oscillation frequency control terminal 3a under a condition that an output wave with the frequency $f_r$ is injected into the second oscillator 3 from the reference oscillator 1, the oscillation frequency is $f_r$ and the phase $\theta_{r2}$ of an output wave is shifted by $-\Delta \theta_2$ on the basis of a difference between the oscillation frequency $f_r$ and the frequency ($f_{o2}-\Delta f_o$).

Here, the first oscillator 2 and the second oscillator 3 are injection-locked voltage-controlled oscillators having the same configuration, and the characteristics of oscillation frequency with respect to control voltages provided to the oscillation frequency control terminals 2a and 3a, etc., are the same, and thus, $f_{o2}$ is substantially equal to $f_{o1}$ and the relation $\Delta \theta_1 = \Delta \theta_2 = \Delta \theta_o$ is satisfied.

Figure 4:
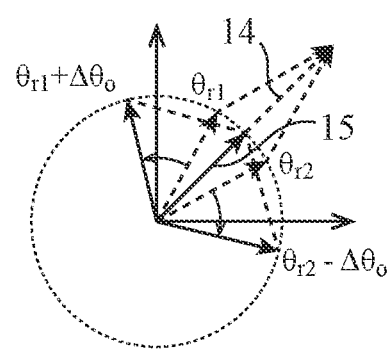

As shown in FIG. 4, the combiner 4 combines an output wave from the first oscillator 2 and an output wave from the second oscillator 3 and outputs the combined output wave.

FIG. 4 is an explanatory diagram showing the phase and amplitude of a combined output wave obtained by the combiner 4 at a time when a control signal that changes an oscillation frequency by $\Delta f_o$ is provided to the oscillation frequency control terminal 2a and a control signal that changes an oscillation frequency by $-\Delta f_o$ is provided to the oscillation frequency control terminal 3a.

In FIG. 4, the reference sign 14 indicates a combined output wave obtained when an output wave with the frequency $f_r$ is injected into each of the first oscillator 2 and the second oscillator 3 and a control signal that changes an oscillation frequency is not provided to the oscillation frequency control terminals 2a and 3a.

The reference sign 15 indicates a combined output wave obtained when an output wave with the frequency $f_r$ is injected into each of the first oscillator 2 and the second oscillator 3, a control signal that changes an oscillation frequency by $\Delta f_o$ is provided to the oscillation frequency control terminal 2a, and a control signal that changes an oscillation frequency by $-\Delta f_o$ is provided to the oscillation frequency control terminal 3a.

When the combined output wave 14 is compared with the combined output wave 15, their phases are the same but their amplitudes are different from each other.

Therefore, by the first controller 5 and the second controller 6, by performing control to shift the phase of an output wave from the first oscillator 2 and the phase of an output wave from the second oscillator 3 in opposite directions, without changing the phase of a combined output wave obtained by the combiner 4, the amplitude can be changed.

Note that by combining the above-described configurations, both the phase and amplitude of a combined output wave obtained by the combiner 4 can be changed, thereby enabling phase and amplitude modulation.

Therefore, the combiner 4 can output a phase-modulated signal, an amplitude-modulated signal, or a phase and amplitude modulated signal as a combined output wave.

In the above-described first embodiment, the phase and amplitude controlled oscillation device is configured in such a manner that the first controller 5 and the second controller 6 control the phase of a combined output wave obtained by the combiner 4 by performing control to shift the phases of respective oscillation frequencies of the first oscillator 2 and the second oscillator 3 in the same direction, and control the amplitude of the combined output wave obtained by the combiner 4 by performing control to shift the phases of the respective oscillation frequencies of the first oscillator 2 and the second oscillator 3 in opposite directions. Therefore, the phase and amplitude controlled oscillation device can control the phase and amplitude of the combined output wave obtained by the combiner 4.

In the phase and amplitude controlled oscillation device of the first embodiment, injection-locked voltage-controlled oscillators are used as the first oscillator 2 and the second oscillator 3. When injection-locked voltage-controlled oscillators are used as the first oscillator 2 and the second oscillator 3, a change in output power with respect to the power of an injection wave is small and the output power is roughly constant. Therefore, since the output power from the first oscillator 2 and the second oscillator 3 to the combiner 4 is roughly constant, fluctuations in the power of a combined output wave at a time when phase control is performed can be reduced, for example.

In addition, when injection-locked voltage-controlled oscillators are used as the first oscillator 2 and the second oscillator 3, the oscillation frequency $f_r$ of the reference oscillator 1 can be one-half, one-third, twice, three times, etc., the oscillation frequency $f_{o1}$ ($\approx f_{o2}$). Therefore, an output wave from the reference oscillator 1 can be a subharmonic, that is, second or higher harmonic, of an output wave from each of the first oscillator 2 and the second oscillator 3 or may be a high-order harmonic.

By setting an output wave from the reference oscillator 1 to be, for example, a subharmonic, the output wave can be transmitted with low loss.

In the phase and amplitude controlled oscillation device of the first embodiment, injection-locked voltage-controlled oscillators are used as the first oscillator 2 and the second oscillator 3. However, this is merely an example and, for example, injection-locked current-controlled oscillators (injection-locked oscillators) may be used as the first oscillator 2 and the second oscillator 3.

Note that when the first oscillator 2 and the second oscillator 3 are injection-locked voltage-controlled oscillators, a control signal outputted from each of the first controller 5 and the second controller 6 is a voltage signal.

When the first oscillator 2 and the second oscillator 3 are injection-locked current-controlled oscillators, a control signal outputted from each of the first controller 5 and the second controller 6 is a current signal.

Second Embodiment

In the phase and amplitude controlled oscillation device of the first embodiment, an output wave from the reference oscillator 1 is injected into each of the first oscillator 2 and the second oscillator 3.

A second embodiment describes a phase and amplitude controlled oscillation device in which an output wave from the reference oscillator 1 is injected into the first oscillator 2 and a part of an output wave from the first oscillator 2 is injected into a second oscillator 8.

Figure 5A:
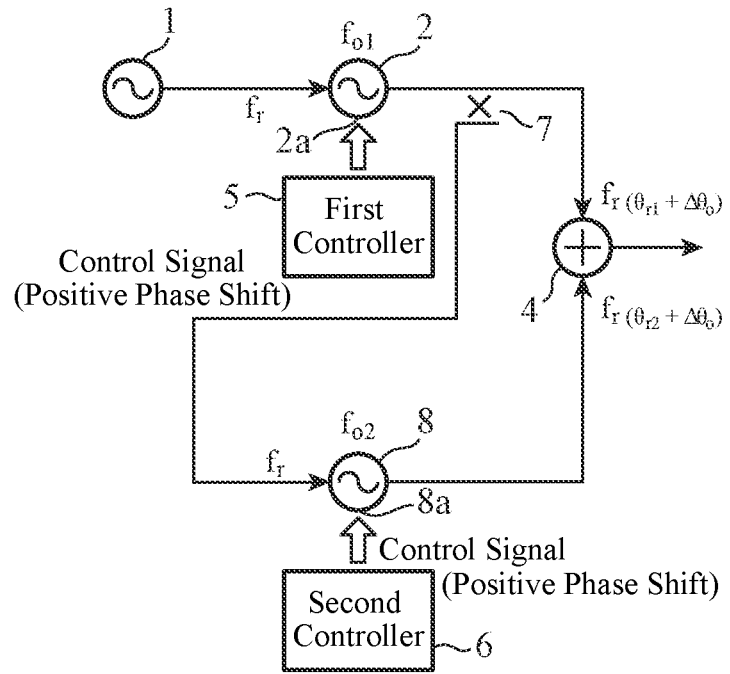
FIG. 5A is a configuration diagram showing a phase and amplitude controlled oscillation device of a second embodiment under a situation in which phase control is performed.
Figure 5B:
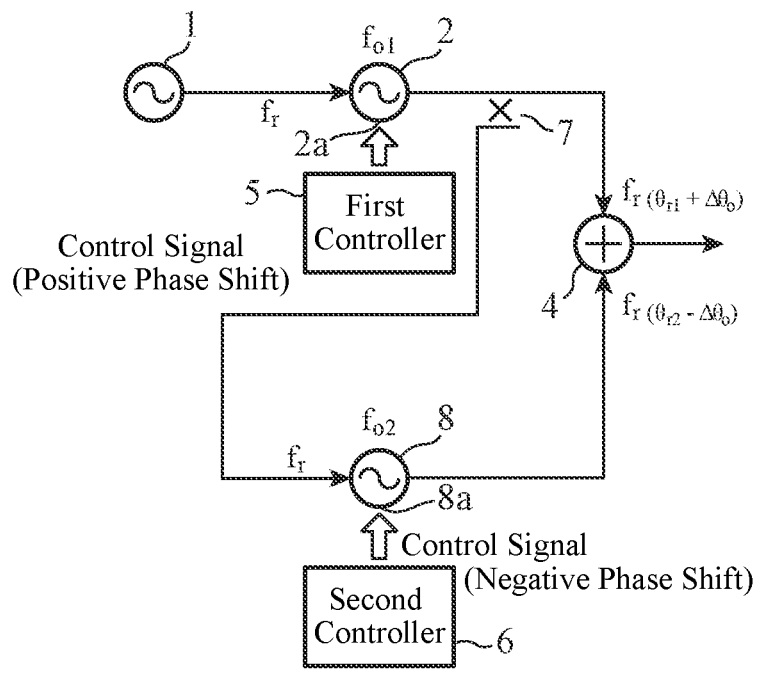
FIG. 5B is a configuration diagram showing the phase and amplitude controlled oscillation device of the second embodiment under a situation in which amplitude control is performed.

Each of FIGS. 5A and 5B is a configuration diagram showing a phase and amplitude controlled oscillation device according to the second embodiment.

FIG. 5A is a configuration diagram showing the phase and amplitude controlled oscillation device of the second embodiment under a situation in which phase control is performed.

FIG. 5B is a configuration diagram showing the phase and amplitude controlled oscillation device of the second embodiment under a situation in which amplitude control is performed.

In FIGS. 5A and 5B, the same reference signs as those of FIGS. 1A and 1B indicate the same or corresponding portions and thus description thereof is omitted.

A splitter 7 splits an output wave from the first oscillator 2, and outputs one split output wave to the combiner 4 and outputs the other split output wave to the second oscillator 8.

The second oscillator 8 is an injection-locked voltage-controlled oscillator into which the other output wave outputted from the splitter 7 is injected.

By the injection of the other output wave outputted from the splitter 7 into the second oscillator 8, the oscillation frequency $f_{o2}$ is locked to the oscillation frequency $f_{o1}$ of the first oscillator 2.

When a control signal is provided from the second controller 6 to an oscillation frequency control terminal 8a, as with the second oscillator 3 shown in FIGS. 1A and 1B, the oscillation frequency $f_{o2}$ of the second oscillator 8 changes.

Next, operation of the phase and amplitude controlled oscillation device shown in FIGS. 5A and 5B will be described.

The phase and amplitude controlled oscillation device shown in FIGS. 5A and 5B differs from the phase and amplitude controlled oscillation device shown in FIGS. 1A and 1B only in that the phase and amplitude controlled oscillation device includes the splitter 7 and the other output wave outputted from the splitter 7 is injected into the second oscillator 8.

By the injection of the other output wave outputted from the splitter 7 into the second oscillator 8, the oscillation frequency $f_{o2}$ is locked to the oscillation frequency $f_{o1}$ of the first oscillator 2.

Since the oscillation frequency $f_{o1}$ is locked to the oscillation frequency $f_r$ of the reference oscillator 1 by injection of an output wave with the frequency $f_r$ into the first oscillator 2 from the reference oscillator 1, the oscillation frequency $f_{o2}$ of the second oscillator 8 also turns out to be locked to the oscillation frequency $f_r$ of the reference oscillator 1.

Therefore, in the phase and amplitude controlled oscillation device shown in FIGS. 5A and 5B, too, as with the phase and amplitude controlled oscillation device shown in FIGS. 1A and 1B, the relation $f_{o1}=f_{o2}=f_r$ is satisfied.

Since control by the first controller 5 and the second controller 6 itself is the same as that of the first embodiment, as with the phase and amplitude controlled oscillation device shown in FIGS. 1A and 1B, the phase and amplitude controlled oscillation device shown in FIGS. 5A and 5B can control the phase and amplitude of a combined output wave obtained by the combiner 4.

Third Embodiment

A third embodiment describes a phase and amplitude controlled oscillation device in which a first oscillator 21 is a first phase-locked oscillator of a fractional-N system and a second oscillator 31 is a second phase-locked oscillator of a fractional-N system.

Figure 6A:
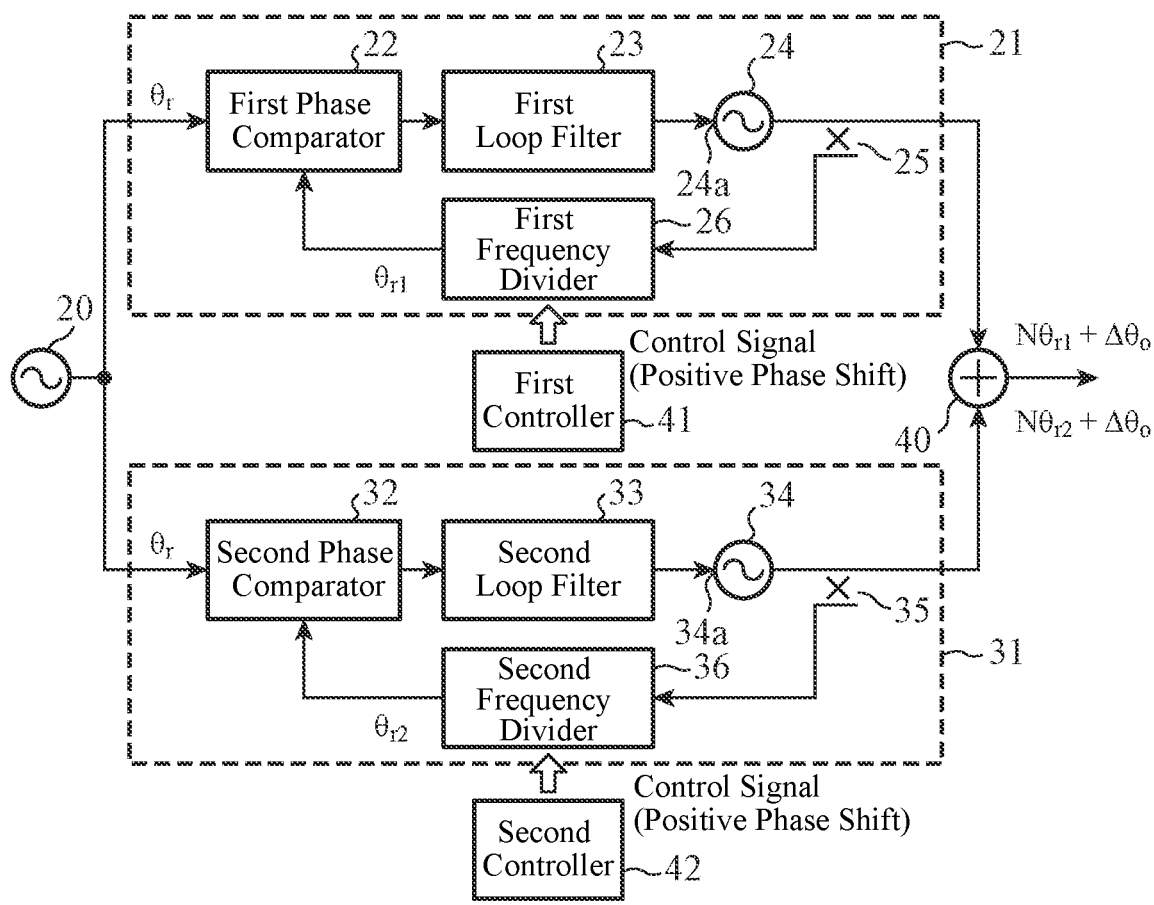
FIG. 6A is a configuration diagram showing a phase and amplitude controlled oscillation device of a third embodiment under a situation in which phase control is performed.
Figure 6B:
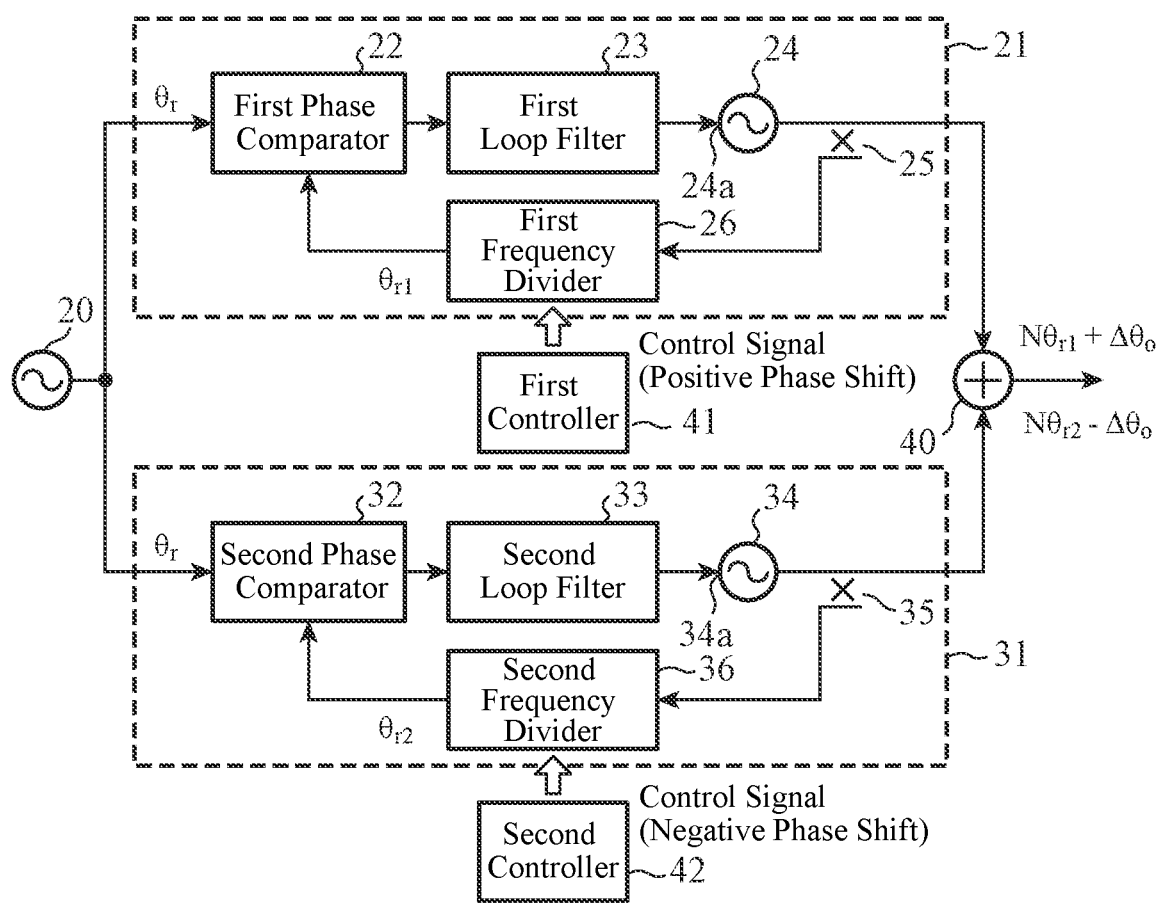
FIG. 6B is a configuration diagram showing the phase and amplitude controlled oscillation device of the third embodiment under a situation in which amplitude control is performed.

Each of FIGS. 6A and 6B is a configuration diagram showing a phase and amplitude controlled oscillation device according to the third embodiment.

FIG. 6A is a configuration diagram showing the phase and amplitude controlled oscillation device of the third embodiment under a situation in which phase control is performed.

FIG. 6B is a configuration diagram showing the phase and amplitude controlled oscillation device of the third embodiment under a situation in which amplitude control is performed.

In FIGS. 6A and 6B, a reference oscillator 20 is a crystal oscillator that outputs an output wave with the frequency $f_r$ and the phase θr to each of the first oscillator 21 and the second oscillator 31.

The first oscillator 21 includes a first phase comparator 22, a first loop filter 23, a first voltage-controlled oscillator 24, a first splitter 25, and a first frequency divider 26.

The first oscillator 21 is a first phase-locked oscillator of a fractional-N system and includes a phase-locked loop (PLL).

An output wave from the first voltage-controlled oscillator 24 is split by the first splitter 25, and one split output wave is outputted to a combiner 40 as an output wave from the first oscillator 21. The other split output wave is outputted to the first frequency divider 26.

The oscillation frequency $f_{o1}$ changes so as to reduce a phase error between the phase of the other split output wave (an output wave from the first voltage-controlled oscillator 24) whose frequency is divided by the first frequency divider 26 and the phase of an output wave from the reference oscillator 20.

The first phase comparator 22 outputs a voltage based on the phase error between the phase $\theta_r$ of the output wave from the reference oscillator 20 and the phase Or of the output wave from the first frequency divider 26, to the first loop filter 23.

The first loop filter 23 allows only components near a direct-current component of the voltage outputted from the first phase comparator 22 to pass therethrough and outputs the components near the direct-current component to an oscillation frequency control terminal 24a of the first voltage-controlled oscillator 24.

Figure 7:
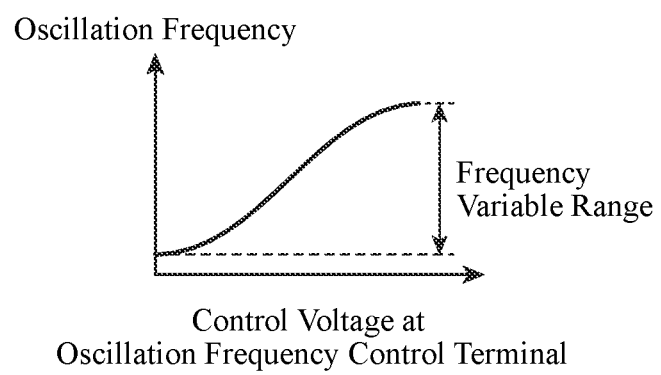
FIG. 7 is an explanatory diagram showing a relationship between a control voltage at each of an oscillation frequency control terminal 24a of a first voltage-controlled oscillator 24 and an oscillation frequency control terminal 34a of a second voltage-controlled oscillator 34 and an oscillation frequency.

The first voltage-controlled oscillator 24 is an oscillator in which when a voltage (control voltage) outputted from the first loop filter 23 is provided to the oscillation frequency control terminal 24a, the oscillation frequency $f_{o1}$ changes on the basis of the control voltage as shown in FIG. 7.

FIG. 7 is an explanatory diagram showing, as an example, a relationship between a control voltage and an oscillation frequency at each of the oscillation frequency control terminal 24a of the first voltage-controlled oscillator 24 and an oscillation frequency control terminal 34a of a second voltage-controlled oscillator 34.

The second oscillator 31 includes a second phase comparator 32, a second loop filter 33, the second voltage-controlled oscillator 34, a second splitter 35, and a second frequency divider 36.

The second oscillator 31 is a second phase-locked oscillator of a fractional-N system and includes a PLL.

An output wave from the second voltage-controlled oscillator 34 is split by the second splitter 35, and one split output wave is outputted to the combiner 40 as an output wave from the second oscillator 31. The other split output wave is outputted to the second frequency divider 36.

The oscillation frequency $f_{o2}$ changes so as to reduce a phase error between the phase of the other split output wave (an output wave from the second voltage-controlled oscillator 34) whose frequency is divided by the second frequency divider 36 and the phase of an output wave from the reference oscillator 20.

The second phase comparator 32 outputs a voltage based on the phase error between the phase $\theta_r$ of the output wave from the reference oscillator 20 and the phase $\theta_{r2}$ of the output wave from the second frequency divider 36, to the second loop filter 33.

The second loop filter 33 allows only components near a direct-current component of the voltage outputted from the second phase comparator 32 to pass therethrough and outputs the components near the direct-current component to the oscillation frequency control terminal 34a of the second voltage-controlled oscillator 34.

The second voltage-controlled oscillator 34 is an oscillator in which when a voltage (control voltage) outputted from the second loop filter 33 is provided to the oscillation frequency control terminal 34a, the oscillation frequency $f_{o2}$ changes as shown in FIG. 7.

The combiner 40 combines one split output wave obtained by the first splitter 25 and the other split output wave obtained by the second splitter 35 and outputs the combined output wave. The combiner 40 is, for example, a power combiner such as a Wilkinson combiner.

A first controller 41 can control the oscillation frequency of the first voltage-controlled oscillator 24 by controlling the frequency division number of the first frequency divider 26, and can control the phase of an output wave from the first voltage-controlled oscillator 24 by changing a control pattern of a frequency division number.

A second controller 42 can control the oscillation frequency of the second voltage-controlled oscillator 34 by controlling the frequency division number of the second frequency divider 36, and can control the phase of an output wave from the second voltage-controlled oscillator 34 by changing a control pattern of a frequency division number.

Next, operation of the phase and amplitude controlled oscillation device shown in FIGS. 6A and 6B will be described.

The reference oscillator 20 outputs an output wave with the frequency $f_r$ and the phase $\theta_r$ to each of the first oscillator 21 and the second oscillator 31.

The first splitter 25 splits an output wave from the first voltage-controlled oscillator 24, and outputs one split output wave to the combiner 40 and outputs the other split output wave to the first frequency divider 26.

When the first frequency divider 26 receives the other split output wave from the first splitter 25, the first frequency divider 26 divides the frequency of the output wave by N (N is an integer greater than or equal to 2) and outputs an output wave with the frequency $f_{o1}/N$ and the phase $\theta_{r1}$ to the first phase comparator 22.

The first phase comparator 22 compares the phase Or of the output wave from the reference oscillator 20 with the phase $\theta_{r1}$ of the output wave from the first frequency divider 26, and outputs a voltage (or a current) based on a phase error ($\theta_r - \theta_{r1}$) between the phase $\theta_r$ and the phase $\theta_{r1}$ to the first loop filter 23.

When the first loop filter 23 receives the voltage (or current) based on the phase error ($\theta_r - \theta_{r1}$) from the first phase comparator 22, the first loop filter 23 allows only components near a direct-current component of the voltage (or current) to pass therethrough and outputs the components near the direct-current component as a control voltage to the oscillation frequency control terminal 24a of the first voltage-controlled oscillator 24.

In the first voltage-controlled oscillator 24, when the control voltage outputted from the first loop filter 23 is provided to the oscillation frequency control terminal 24a, the oscillation frequency $f_{o1}$ changes on the basis of the control voltage as shown in FIG. 7.

The oscillation frequency $f_{o1}$ of the first voltage-controlled oscillator 24 is locked to the oscillation frequency $f_r$ of the reference oscillator 20 and the relation $f_{o1} = Nf_r$ is established, and the phase $N\theta_{r1}$ of an output wave from the first voltage-controlled oscillator 24 is locked to the phase Or of the output wave from the reference oscillator 20 and the relation $\theta_{r1} = \theta_r$ is established.

The second splitter 35 splits an output wave from the second voltage-controlled oscillator 34, and outputs one split output wave to the combiner 40 and outputs the other split output wave to the second frequency divider 36.

When the second frequency divider 36 receives the other split output wave from the second splitter 35, the second frequency divider 36 divides the frequency of the output wave by N and outputs an output wave with the frequency $f_{o2}/N$ and the phase $\theta_{r2}$ to the second phase comparator 32.

The second phase comparator 32 compares the phase $\theta_r$ of the output wave from the reference oscillator 20 with the phase $\theta_{r2}$ of the output wave from the second frequency divider 36, and outputs a voltage (or a current) based on a phase error $(\theta_r-\theta_{r2})$ between the phase $\theta_r$ and the phase $\theta_{r2}$ to the second loop filter 33.

When the second loop filter 33 receives the voltage (or current) based on the phase error $(\theta_r-\theta_{r2})$ from the second phase comparator 32, the second loop filter 33 allows only components near a direct-current component of the voltage (or current) to pass therethrough and outputs the components near the direct-current component as a control voltage to the oscillation frequency control terminal 34a of the second voltage-controlled oscillator 34.

In the second voltage-controlled oscillator 34, when the control voltage outputted from the second loop filter 33 is provided to the oscillation frequency control terminal 34a, the oscillation frequency $f_{o2}$ changes on the basis of the control voltage as shown in FIG. 7.

The oscillation frequency $f_{o2}$ of the second voltage-controlled oscillator 34 is locked to the oscillation frequency $f_r$ of the reference oscillator 20 and the relation $f_{o2}=Nf_r$ is established, and the phase $N\theta_{r2}$ of an output wave from the second voltage-controlled oscillator 34 is locked to the phase $\theta_r$ of the output wave from the reference oscillator 20 and the relation $\theta_{r2}=\theta_r$ is established.

The first controller 41 controls the frequency division number N of the first frequency divider 26.

By the first controller 41 changing the frequency division number N of the first frequency divider 26, a control voltage outputted from the first loop filter 23 to the oscillation frequency control terminal 24a of the first voltage-controlled oscillator 24 changes and the oscillation frequency changes.

In the fractional-N system, the frequency division number N is given by an average value Nave in a given period. When Nave is constant, the oscillation frequency is constant. Here, by shifting the timing of a control pattern of a frequency division number in a period, the phase can be changed with the oscillation frequency remaining constant. For example, when the frequency division number is 100, 100, 100, and 101, the average value is 100.25 and even when the frequency division number is changed to 100, 101, 100, and 100 by shifting the timing, the average value is 100.25. At this time, the control pattern of a frequency division number is a pattern that is offset along a time axis, and thus, the oscillation frequency does not change but the phase changes.

The second controller 42 controls the frequency division number N of the second frequency divider 36.

By the second controller 42 changing the frequency division number N of the second frequency divider 36, a control voltage outputted from the second loop filter 33 to the oscillation frequency control terminal 34a of the second voltage-controlled oscillator 34 changes and the oscillation frequency changes.

In the second oscillator 31, too, when Nave is constant, the oscillation frequency is constant. By shifting the timing of a control pattern of a frequency division number in a period, the phase can be changed with the oscillation frequency remaining constant.

Here, the first controller 41 performs control of a first control pattern in which the timing of a control pattern of a frequency division number is shifted with the average value of a frequency division number in a given period of the first frequency divider 26 remaining constant.

By the first controller 41 controlling the first control pattern, the phase of an output wave from the first voltage-controlled oscillator 24 can be shifted without changing the frequency $f_{o1}$ $(=Nf_r)$ of the output wave from the first voltage-controlled oscillator 24.

Namely, the first controller 41 controls timing at which the first control pattern is offset or timing at which the first control pattern is reset, with the average value of a frequency division number remaining constant.

The second controller 42 performs control of a second control pattern in which the timing of a control pattern of a frequency division number is shifted with the average value of a frequency division number in a given period of the second frequency divider 36 remaining constant.

By the second controller 42 controlling the second control pattern, the phase of an output wave from the second voltage-controlled oscillator 34 can be shifted without changing the frequency $f_{o2}$ $(=Nf_r)$ of the output wave from the second voltage-controlled oscillator 34.

Namely, the second controller 42 controls timing at which the second control pattern is offset or timing at which the second control pattern is reset, with the average value of a frequency division number remaining constant.

Specifically, by the first controller 41, for example, advancing timing at which the first control pattern is outputted to the first frequency divider 26 by $\Delta t$, the phase of an output wave from the first voltage-controlled oscillator 24 can be shifted by A.

By the first controller 41, for example, delaying timing at which the first control pattern is outputted to the first frequency divider 26 by $\Delta t$, the phase of an output wave from the first voltage-controlled oscillator 24 can be shifted by $-\Delta\theta_o$.

By the second controller 42, for example, advancing timing at which the second control pattern is outputted to the second frequency divider 36 by $\Delta t$, the phase of an output wave from the second voltage-controlled oscillator 34 can be shifted by $\Delta\theta_o$.

By the second controller 42, for example, delaying timing at which the second control pattern is outputted to the second frequency divider 36 by $\Delta t$, the phase of an output wave from the second voltage-controlled oscillator 34 can be shifted by $-\Delta\theta_o$.

When the combiner 40 combines a split output wave obtained by the first splitter 25 and a split output wave obtained by the second splitter 35 when the first controller 41 shifts the phase by $\Delta\theta_o$ and the second controller 42 shifts the phase by $\Delta\theta_o$, the amplitude of the combined output wave does not change, but the phase is shifted by $\Delta\theta_o$. By continuously performing this process, phase modulation can be performed.

When the combiner 40 combines a split output wave obtained by the first splitter 25 and a split output wave obtained by the second splitter 35 when the first controller 41 shifts the phase by $\Delta\theta_o$ and the second controller 42 shifts the phase by $-\Delta\theta_o$, the phase of the combined output wave does not change, but the amplitude changes. By continuously performing this process, amplitude modulation can be performed.

Note that by the above-described combination, both the phase and amplitude of a combined output wave obtained by the combiner 40 can be changed, thereby enabling phase and amplitude modulation.

Therefore, the combiner 40 can output a phase-modulated signal, an amplitude-modulated signal, or a phase and amplitude modulated signal as a combined output wave.

In the above-described third embodiment, the phase and amplitude controlled oscillation device is configured in such a manner that the first controller 41 controls the phase of an output wave from the first phase-locked oscillator by controlling the frequency division number of the first phase-locked oscillator, and the second controller 42 controls the phase of an output wave from the second phase-locked oscillator by controlling the frequency division number of the second phase-locked oscillator. Therefore, the phase and amplitude controlled oscillation device can control the phase and amplitude of a combined output wave obtained by the combiner 40.

In the phase and amplitude controlled oscillation device of the third embodiment, phase-locked oscillators of a fractional-N system are used as the first oscillator 21 and the second oscillator 31. When phase-locked oscillators of a fractional-N system are used as the first oscillator 21 and the second oscillator 31, not only the phase and amplitude of a combined output wave obtained by the combiner 40, but also the frequency of the combined output wave can be controlled.

In addition, when phase-locked oscillators of a fractional-N system are used as the first oscillator 21 and the second oscillator 31, each of the first controller 41 and the second controller 42 can be composed of a digital circuit.

Fourth Embodiment

In the phase and amplitude controlled oscillation device of the third embodiment, an output wave from the reference oscillator 20 is outputted to each of the first phase comparator 22 and the second phase comparator 32.

A fourth embodiment describes a phase and amplitude controlled oscillation device in which an output wave from the reference oscillator 20 is outputted to the first phase comparator 22 and an output wave from the first frequency divider 26 is outputted to a second phase comparator 37.

Figure 8A:
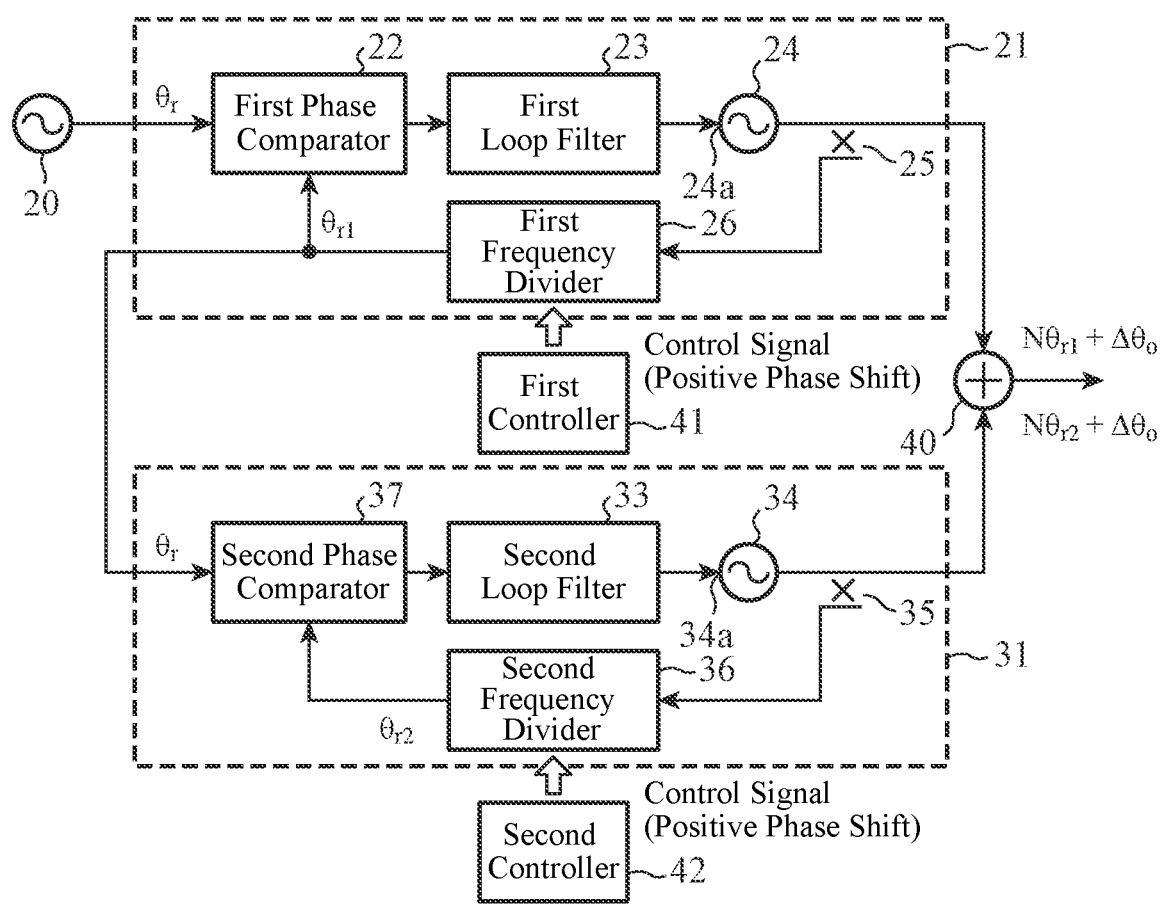
FIG. 8B is a configuration diagram showing the phase and amplitude controlled oscillation device of the fourth embodiment under a situation in which amplitude control is performed.
Figure 8B:
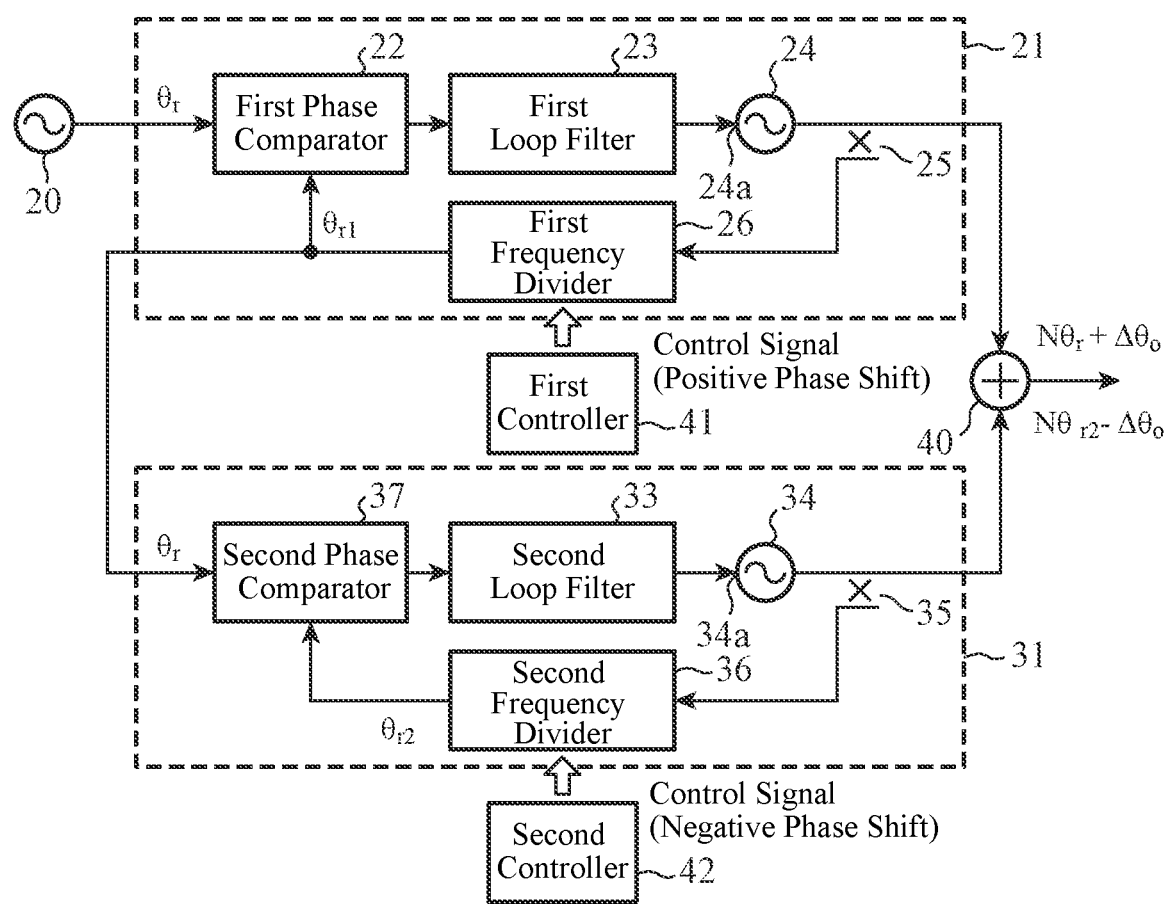

Each of FIGS. 8A and 8B is a configuration diagram showing a phase and amplitude controlled oscillation device according to the fourth embodiment.

FIG. 8A is a configuration diagram showing the phase and amplitude controlled oscillation device of the fourth embodiment under a situation in which phase control is performed.

FIG. 8B is a configuration diagram showing the phase and amplitude controlled oscillation device of the fourth embodiment under a situation in which amplitude control is performed.

In FIGS. 8A and 8B, the same reference signs as those of FIGS. 1 and 6 indicate the same or corresponding portions and thus description thereof is omitted.

The second oscillator 31 includes the second phase comparator 37, the second loop filter 33, the second voltage-controlled oscillator 34, the second splitter 35, and the second frequency divider 36.

The second phase comparator 37 outputs a voltage based on a phase error between the phase $\theta_{r1}$ of an output wave from the first frequency divider 26 and the phase $\theta_{r2}$ of an output wave from the second frequency divider 36, to the second loop filter 33.

Next, operation of the phase and amplitude controlled oscillation device shown in FIGS. 8A and 8B will be described.

The phase and amplitude controlled oscillation device shown in FIGS. 8A and 8B differs from the phase and amplitude controlled oscillation device shown in FIGS. 6A and 6B only in that the second oscillator 31 includes the second phase comparator 37 instead of the second phase comparator 32.

When the second oscillator 31 includes the second phase comparator 37, in the first phase comparator 22, the relation $\theta_{r1}=\theta_r$ is satisfied and in the second phase comparator 37, the relation $\theta_{r2}=\theta_{r1}$ is satisfied. Therefore, the first oscillator 21 is locked to the reference oscillator 20 and the second oscillator 31 is locked to the first oscillator 21, and thus, the second oscillator 31 turns out to be locked to the reference oscillator 20.

Since control by the first controller 41 and the second controller 42 itself is the same as that of the third embodiment, as with the phase and amplitude controlled oscillation device shown in FIGS. 6A and 6B, the phase and amplitude controlled oscillation device shown in FIGS. 8A and 8B can control the phase and amplitude of a combined output wave obtained by the combiner 40.

Note that in the invention of this application, a free combination of the embodiments, modifications to any component of the embodiments, or omissions of any component in the embodiments are possible within the scope of the invention.

INDUSTRIAL APPLICABILITY

The invention is suitable for a phase and amplitude controlled oscillation device that controls the phase and amplitude of an output wave.

REFERENCE SIGNS LIST

1: reference oscillator, 2: first oscillator, 2a: oscillation frequency control terminal, 3: second oscillator, 3a: oscillation frequency control terminal, 4: combiner, 5: first controller, 6: second controller, 7: splitter, 8: second oscillator, 8a: oscillation frequency control terminal, 11 to 15: combined output wave, 20: reference oscillator, 21: first oscillator, 22: first phase comparator, 23: first loop filter, 24: first voltage-controlled oscillator, 24a: oscillation frequency control terminal, 25: first splitter, 26: first frequency divider, 31: second oscillator, 32, 37: second phase comparator, 33: second loop filter, 34: second voltage-controlled oscillator, 34a: oscillation frequency control terminal, 35: second splitter, 36: second frequency divider, 40: combiner, 41: first controller, 42: second controller

The invention claimed is:

1. A phase and amplitude controlled oscillation device comprising:
a reference oscillator outputting an oscillation frequency;
a first oscillator whose oscillation frequency is locked to the oscillation frequency of the reference oscillator using an output wave of the reference oscillator;
a second oscillator whose oscillation frequency is locked to the oscillation frequency of the reference oscillator using an output wave obtained by splitting the output wave of the reference oscillator or using an output wave of the first oscillator which is synchronized with an oscillation frequency of the reference oscillator;

a combiner generating a combined output wave by combining an output wave from the first oscillator and an output wave from the second oscillator;
a first controller controlling a phase of the oscillation frequency of the first oscillator; and
a second controller controlling a phase of the oscillation frequency of the second oscillator, wherein
the first and second controllers control a phase of the combined output wave generated by the combiner by performing control to shift the phases of the oscillation frequencies of the respective first and second oscillators in a same direction, and control an amplitude of the combined output wave generated by the combiner by performing control to shift the phases of the oscillation frequencies of the respective first and second oscillators in opposite directions.

2. The phase and amplitude controlled oscillation device according to claim 1, wherein
each of the first oscillator and the second oscillator is an injection-locked oscillator, and
the oscillation frequencies of the respective first and second oscillators are locked to the oscillation frequency of the reference oscillator by injecting an output wave from the reference oscillator into each of the first and second oscillators.

3. The phase and amplitude controlled oscillation device according to claim 1, further comprising
a splitter splitting the output wave from the first oscillator into a first split output wave and a second split output wave, and outputting the first split output wave to the combiner and outputting the second split output wave to the second oscillator, wherein
each of the first oscillator and the second oscillator is an injection-locked oscillator,
the oscillation frequency of the first oscillator is locked to the oscillation frequency of the reference oscillator by injecting an output wave from the reference oscillator into the first oscillator, and
the oscillation frequency of the second oscillator is locked to the oscillation frequency of the first oscillator by injecting the second split output wave outputted from the splitter into the second oscillator.

4. The phase and amplitude controlled oscillation device according to claim 1, wherein
the first controller controls the phase of the oscillation frequency of the first oscillator by controlling a direct-current voltage or current to be applied to a terminal for controlling the oscillation frequency of the first oscillator, and
the second controller controls the phase of the oscillation frequency of the second oscillator by controlling a direct-current voltage or current to be applied to a terminal for controlling the oscillation frequency of the second oscillator.

5. The phase and amplitude controlled oscillation device according to claim 1, wherein
the first oscillator is a first phase-locked oscillator of a fractional-N system generating a first frequency-divided output wave by dividing a frequency of a part of the output wave outputted to the combiner, and controlling an oscillation frequency so as to reduce a phase error between a phase of the first frequency-divided output wave and a phase of an output wave from the reference oscillator,
the second oscillator is a second phase-locked oscillator of a fractional-N system generating a second frequency-divided output wave by dividing a frequency of a part of the output wave outputted to the combiner, and controlling an oscillation frequency so as to reduce a phase error between a phase of the second frequency-divided output wave and the phase of the output wave from the reference oscillator,
the first controller controls a phase of the oscillation frequency of the first phase-locked oscillator by controlling a control pattern of a frequency division number of the first phase-locked oscillator, and
the second controller controls a phase of the oscillation frequency of the second phase-locked oscillator by controlling a control pattern of a frequency division number of the second phase-locked oscillator.

6. The phase and amplitude controlled oscillation device according to claim 5, wherein
the first phase-locked oscillator includes:
a first voltage-controlled oscillator whose oscillation frequency changes in accordance with a control voltage;
a first splitter splitting an output wave from the first voltage-controlled oscillator into a first split output wave and a second split output wave and outputting the first split output wave obtained by the first splitter to the combiner;
a first frequency divider dividing a frequency of a second split output wave obtained by the first splitter;
a first phase comparator outputting a control voltage on a basis of a phase error between the phase of the output wave from the reference oscillator and a phase of an output wave from the first frequency divider; and
a first loop filter outputting the control voltage outputted from the first phase comparator to the first voltage-controlled oscillator,
the second phase-locked oscillator includes:
a second voltage-controlled oscillator whose oscillation frequency changes in accordance with a control voltage;
a second splitter splitting an output wave from the second voltage-controlled oscillator into a first split output wave and a second split output wave and outputting the first split output wave obtained by the second splitter to the combiner;
a second frequency divider dividing a frequency of a second split output wave obtained by the second splitter;
a second phase comparator outputting a control voltage on a basis of a phase error between the phase of the output wave from the reference oscillator and a phase of an output wave from the second frequency divider; and
a second loop filter outputting the control voltage outputted from the second phase comparator to the second voltage-controlled oscillator,
the first controller controls a control pattern of a frequency division number of the first frequency divider, and
the second controller controls a control pattern of a frequency division number of the second frequency divider.

7. The phase and amplitude controlled oscillation device according to claim 6, wherein
the first controller controls the phase of the oscillation frequency of the first oscillator by giving an offset to the control pattern of a frequency division number of the first frequency divider, and
the second controller controls the phase of the oscillation frequency of the second oscillator by giving an offset to the control pattern of a frequency division number of the second frequency divider.

8. The phase and amplitude controlled oscillation device according to claim 1, wherein the first oscillator is a first phase-locked oscillator of a fractional-N system generating a first frequency-divided output wave by dividing a frequency of a part of the output wave outputted to the combiner, and controlling an oscillation frequency so as to reduce a phase error between a phase of the first frequency-divided output wave and a phase of an output wave from the reference oscillator, the second oscillator is a second phase-locked oscillator of a fractional-N system generating a second frequency-divided output wave by dividing a frequency of a part of the output wave outputted to the combiner, and controlling an oscillation frequency so as to reduce a phase error between a phase of the second frequency-divided output wave and the phase of the first frequency-divided output wave obtained by the first phase-locked oscillator, the first controller controls a phase of the oscillation frequency of the first phase-locked oscillator by controlling a control pattern of a frequency division number of the first phase-locked oscillator, and the second controller controls a phase of the oscillation frequency of the second phase-locked oscillator by controlling a control pattern of a frequency division number of the second phase-locked oscillator.

9. The phase and amplitude controlled oscillation device according to claim 8, wherein the first phase-locked oscillator includes:

a first voltage-controlled oscillator whose oscillation frequency changes in accordance with a control voltage;

a first splitter splitting an output wave from the first voltage-controlled oscillator into a first split output wave and a second split output wave and outputting the first split output wave obtained by the first splitter to the combiner;

a first frequency divider dividing a frequency of a second split output wave obtained by the first splitter;

a first phase comparator outputting a control voltage based on a phase error between the phase of the output wave from the reference oscillator and a phase of an output wave from the first frequency divider; and a first loop filter outputting the control voltage outputted from the first phase comparator to the first voltage-controlled oscillator, the second phase-locked oscillator includes:

a second voltage-controlled oscillator whose oscillation frequency changes in accordance with a control voltage;

a second splitter splitting an output wave from the second voltage-controlled oscillator into a first split output wave and a second split output wave and outputting the first split output wave obtained by the second splitter to the combiner;

a second frequency divider dividing a frequency of a second split output wave obtained by the second splitter;

a second phase comparator outputting a control voltage based on a phase error between a phase of the output wave whose frequency is divided by the first frequency divider and a phase of an output wave from the second frequency divider; and a second loop filter outputting the control voltage outputted from the second phase comparator to the second voltage-controlled oscillator, the first controller controls a control pattern of a frequency division number of the first frequency divider, and the second controller controls a control pattern of a frequency division number of the second frequency divider.

10. The phase and amplitude controlled oscillation device according to claim 6, wherein the first controller outputs a first control pattern, in which an average value of a frequency division number of the first frequency divider in a constant period is a constant, to the first frequency divider, and controls the phase of the oscillation frequency of the first oscillator by controlling the first control pattern, and the second controller outputs a second control pattern, in which an average value of a frequency division number of the second frequency divider in a constant period is a constant, to the second frequency divider, and controls the phase of the oscillation frequency of the second oscillator by controlling the second control pattern.

11. The phase and amplitude controlled oscillation device according to claim 1, wherein, by controlling the phases of the oscillation frequencies of the first and second oscillators by the first and second controllers, the combiner outputs a phase-modulated signal, an amplitude-modulated signal, or a phase and amplitude modulated signal as the combined output wave.

\* \* \* \* \*